(12) United States Patent
Yamada et al.

(10) Patent No.: US 10,727,167 B2
(45) Date of Patent: Jul. 28, 2020

(54) POWER SEMICONDUCTOR DEVICE AND METHOD FOR MANUFACTURING POWER SEMICONDUCTOR DEVICE

(71) Applicant: MITSUBISHI ELECTRIC CORPORATION, Chiyoda-ku, Tokyo (JP)

(72) Inventors: Takayuki Yamada, Tokyo (JP); Noriyuki Besshi, Tokyo (JP); Yuya Muramatsu, Tokyo (JP); Masaru Fuku, Tokyo (JP); Dai Nakajima, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/069,192

(22) PCT Filed: Jan. 6, 2017

(86) PCT No.: PCT/JP2017/000314
§ 371 (c)(1),
(2) Date: Jul. 11, 2018

(87) PCT Pub. No.: WO2017/126344
PCT Pub. Date: Jul. 27, 2017

(65) Prior Publication Data
US 2019/0006265 A1    Jan. 3, 2019

(30) Foreign Application Priority Data

Jan. 19, 2016 (JP) .................................. 2016-007583
Mar. 3, 2016 (JP) .................................. 2016-040621

(51) Int. Cl.
*H01L 23/492* (2006.01)
*H01L 29/12* (2006.01)
(Continued)

(52) U.S. Cl.
CPC ...... *H01L 23/4924* (2013.01); *H01L 21/4875* (2013.01); *H01L 21/52* (2013.01);
(Continued)

(58) Field of Classification Search
CPC . H01L 23/48; H01L 23/485; H01L 23/49562; H01L 23/4924; H01L 23/49;
(Continued)

(56) References Cited

U.S. PATENT DOCUMENTS

2005/0158979 A1    7/2005  Momota et al.
2014/0001480 A1*   1/2014  Otremba ........... H01L 23/49562
                                                        257/76
(Continued)

FOREIGN PATENT DOCUMENTS

JP    2000-188406 A    7/2000
JP    2004-363518 A    12/2004
(Continued)

OTHER PUBLICATIONS

International Search Report (PCT/ISA/210) dated Mar. 28, 2017, by the Japanese Patent Office as the International Searching Authority for International Application No. PCT/JP2017/000314.
(Continued)

*Primary Examiner* — Cuong Q Nguyen
(74) *Attorney, Agent, or Firm* — Buchanan Ingersoll & Rooney PC

(57) ABSTRACT

This power semiconductor device is provided with: a substrate; and a semiconductor element which is bonded onto the substrate using a sinterable metal bonding material. The semiconductor element comprises: a base; a first conductive layer that is provided on a first surface of the base, said first surface being on the substrate side; and a second conductive layer that is provided on a second surface of the base, said second surface being on the reverse side of the first surface.

(Continued)

The thickness of the first conductive layer is from 0.5 times to 2.0 times (inclusive) the thickness of the second conductive layer.

9 Claims, 9 Drawing Sheets

(51) Int. Cl.
| | |
|---|---|
| *H01L 21/52* | (2006.01) |
| *H01L 23/00* | (2006.01) |
| *H01L 29/417* | (2006.01) |
| *H01L 29/66* | (2006.01) |
| *H01L 21/48* | (2006.01) |
| *H01L 29/739* | (2006.01) |

(52) U.S. Cl.
CPC .............. *H01L 24/06* (2013.01); *H01L 24/83* (2013.01); *H01L 29/12* (2013.01); *H01L 29/417* (2013.01); *H01L 29/66333* (2013.01); *H01L 29/7393* (2013.01); *H01L 24/05* (2013.01); *H01L 24/29* (2013.01); *H01L 24/32* (2013.01); *H01L 2224/04026* (2013.01); *H01L 2224/05023* (2013.01); *H01L 2224/05124* (2013.01); *H01L 2224/05155* (2013.01); *H01L 2224/05166* (2013.01); *H01L 2224/05568* (2013.01); *H01L 2224/05583* (2013.01); *H01L 2224/05624* (2013.01); *H01L 2224/05644* (2013.01); *H01L 2224/06181* (2013.01); *H01L 2224/293* (2013.01); *H01L 2224/2929* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29369* (2013.01); *H01L 2224/32225* (2013.01); *H01L 2224/32245* (2013.01); *H01L 2224/33181* (2013.01); *H01L 2224/73263* (2013.01); *H01L 2224/83048* (2013.01); *H01L 2224/8384* (2013.01); *H01L 2224/83097* (2013.01); *H01L 2224/83192* (2013.01); *H01L 2224/83201* (2013.01); *H01L 2924/3511* (2013.01)

(58) Field of Classification Search
CPC ....... H01L 23/52; H01L 23/564; H01L 29/16; H01L 29/20; H01L 29/1602; H01L 29/2003; H01L 29/7393
See application file for complete search history.

(56) References Cited

U.S. PATENT DOCUMENTS

| | | | |
|---|---|---|---|
| 2014/0138710 A1* | 5/2014 | Ohtsu | .................. H01L 23/3735 257/77 |
| 2015/0061114 A1* | 3/2015 | Narita | ............... H01L 23/49513 257/734 |
| 2015/0069613 A1* | 3/2015 | Shiraishi | ............. H01L 29/7397 257/766 |

FOREIGN PATENT DOCUMENTS

| | | | |
|---|---|---|---|
| JP | 2005-019830 | A | 1/2005 |
| JP | 2008-212976 | A | 9/2006 |
| JP | 2007-44754 | A | 2/2007 |
| JP | 2008-305948 | A | 12/2008 |
| JP | 5449958 | B2 | 3/2014 |
| JP | 2014-127629 | A | 7/2014 |
| JP | 5627789 | B2 | 11/2014 |
| JP | 2015-50347 | A | 3/2015 |
| JP | 2 940 727 | A1 | 11/2015 |
| JP | 2016-143694 | A | 8/2016 |

OTHER PUBLICATIONS

Office Action (Notification of Reasons for Refusal) dated Nov. 20, 2018, by the Japan Patent Office in corresponding Japanese Patent Application No. 2017-562511 and English translation of the Office Action. (11 pages).

Office Action (Notification of Reason for Refusal) dated Feb. 12, 2020, by the Korean Patent Office in corresponding Korean Patent Application No. 10-2018-7020060 and English translation of the Office Action. (13 pages).

* cited by examiner

POWER SEMICONDUCTOR DEVICE AND METHOD FOR MANUFACTURING POWER SEMICONDUCTOR DEVICE

TECHNICAL FIELD

The present invention relates to a power semiconductor device having a semiconductor element bonded to a substrate by using a sinterable metal bonding material and a method for manufacturing the same.

BACKGROUND ART

A power module (or power semiconductor device) may have a vertical semiconductor element such as an IGBT (Insulated Gate Bipolar Transistor) and a diode mounted thereon as a switching element or a rectifying element. This vertical semiconductor element has, for example, a rear-surface metallized layer (rear-surface electrode) disposed on an entire rear surface thereof and a front-surface metallized layer (front-surface electrode) disposed on a portion of a front surface opposite to the rear surface. Ni, Mo, or Cr may be used as a metal material constituting the metallized layers. The rear-surface electrode is electrically connected to a substrate electrode, and the front-surface electrode is electrically connected through a wiring member to an external terminal, so that a wiring structure is formed for applying a large current to the power module.

To reduce a power loss, semiconductor elements are recently developed by using wide band gap semiconductor materials such as silicon carbide (SiC) and gallium nitride (GaN) instead of silicon (Si). A semiconductor element using a wide band gap semiconductor material has high heat resistance and therefore can operate at a high temperature with a large current and, on the other hand, it is necessary to use a bonding material having high heat resistance performance for achieving the characteristics. However, no lead-free solder material having high heat resistance performance is currently found.

On the other hand, it is strongly required to miniaturize a semiconductor element by improving a heat dissipation property of a bonding portion between a rear-surface electrode and a substrate electrode of the semiconductor element. To improve the heat dissipation property, it is effective to make a bonding layer thinner. A solder material is conventionally used for bonding between the rear-surface electrode and the substrate electrode. However, since the solder material has difficulty in ensuring the reliability of the bonding portion and tends to deteriorate the heat dissipation property due to generation of voids, it is not preferable to make the bonding layer thinner. Therefore, to achieve miniaturization etc. of the power module, needs exist for a bonding material or a bonding method excellent in the heat dissipation property and less likely to cause deterioration in the bonding portion.

Thus, studies are conducted for a power module having a semiconductor element bonded to a substrate by using a sinterable metal bonding material utilizing a sintering phenomenon of metal fine particles, instead of the solder material (see, e.g., Patent Documents 1 to 3). The sinterable metal bonding material is a pasty bonding material composed of metal fine particles, an organic solvent component, and a protective film covering the metal fine particles. The sinterable metal bonding material achieves metal bonding to a member to be bonded by utilizing a phenomenon that the metal fine particles are sintered at a temperature lower than the melting point of the metal. After bonding, diffusion bonding occurs between the metal fine particles, and diffusion bonding occurs also between a metalized layer of a semiconductor element and a surface of a substrate on which the semiconductor element is mounted, so that the melting point after bonding is increased to the original melting point for the metal. As a result, the power module using the sinterable metal bonding material may have a heat resistance performance higher than the temperature at the time of bonding. Additionally, gold (Au), silver (Ag), and copper (Cu) generally well known as the sinterable metal bonding materials have a thermal conductivity greater than the solder material, can make a bonding layer thinner, and therefore has a high heat radiation performance.

As described above, the sinterable metal bonding material has high heat resistance performance. However, using the sinterable metal bonding material causes the following new problem that does not occur when the solder material is used. Specifically, since a stress is released in the solder material due to development of cracks inside, stress concentration hardly occurs on a base and a metallized layer of a semiconductor element. On the other hand, the sinterable metal bonding material has high strength and therefore has a problem that when thermal stress is repeatedly applied, a damage is caused in the base and the metallized layer of the semiconductor element due to occurrence of cracks etc. in the bonding portion, which makes the reliability of the power module liable to deteriorate.

To deal with this problem, for example, as shown in FIG. 8 of Patent Document 3, it is conceivable that a low thermal expansion plate is disposed between the semiconductor element and the substrate electrode (base electrode) to increase the bonding layer as a whole and thereby relax the thermal stress applied to the bonding portion of the semiconductor element so as to improve the reliability of the power module.

PRIOR ART DOCUMENTS

Patent Documents

Patent Document 1: Japanese Laid-Open Patent Publication No. 2008-212976
Patent Document 2: Japanese Laid-Open Patent Publication No. 2007-44754
Patent Document 3: Japanese Patent No. 5449958
Patent Document 4: Japanese Laid-Open Patent Publication No. 2000-188406
Patent Document 5: Japanese Laid-Open Patent Publication No. 2004-363518

SUMMARY OF THE INVENTION

Problem to be Solved by the Invention

If a sinterable metal bonding material is used for bonding a semiconductor element to a substrate, after the sinterable metal bonding material is disposed on the substrate, it is common to dry the bonding material to remove an organic dispersant in the bonding material before the semiconductor element is mounted on the bonding material. After the drying step, the semiconductor element is temporarily fixed on the sinterable metal bonding material. At this step, the sinterable metal bonding material with the organic dispersant removed has viscosity lower than a solder paste, and therefore, if the semiconductor element is warped due to, for example, an influence of a thermal process at the time of manufacturing of the semiconductor device, a contact area becomes small between the semiconductor element and the sinterable metal bonding material, which weakens a force of holding the semiconductor element on the substrate by the bonding material. It is known that the warp of the semiconductor element becomes larger when a difference in thickness is larger between metallized layers disposed on the front and rear surfaces.

When the force of holding the semiconductor element on the substrate is weakened, the semiconductor element is easily displaced from a desired position on the substrate before bonding after the semiconductor element is mounted on the bonding material. If the displacement (deviation) of the semiconductor element is significant, a power module may not normally operate and may become defective. As described above, the conventional technique cannot achieve a high yield when the sinterable metal bonding material is used for bonding a semiconductor element to a substrate.

In the power module described in FIG. 8 of Patent Document 3, since a special layer (low thermal expansion plate) is disposed for relieving a thermal stress applied to the semiconductor element, required materials and the number of steps increase, so that manufacturing costs increase. Therefore, it is required to improve the reliability of the power module without disposing a special layer for relieving the thermal stress applied to the bonding portion of the semiconductor element.

A first object of the present invention is to achieve a high yield in a power semiconductor device having a semiconductor element bonded on a substrate by using a sinterable metal bonding material.

A second object of the present invention is to achieve a high reliability in the power semiconductor device.

Means for Solving Problem

A power semiconductor device according to an embodiment of the present invention comprises a substrate; and a semiconductor element bonded on the substrate by using a sinterable metal bonding material. The semiconductor element has a base, a first conductive layer disposed on a first surface on a substrate side of the base, and a second conductive layer disposed on a second surface opposite to the first surface of the base. The thickness of the first conductive layer is from 0.5 times to 2.0 times (inclusive) the thickness of the second conductive layer.

In a preferred embodiment, the thickness of the first conductive layer is from 0.55 times to 1.8 times (inclusive) the thickness of the second conductive layer.

In a preferred embodiment, if the linear expansion coefficient of the substrate is equal to or greater than the linear expansion coefficient of the semiconductor element, the thickness of the first conductive layer is from 1.0 times to 1.8 times (inclusive) the thickness of the second conductive layer. If the linear expansion coefficient of the substrate is smaller than the linear expansion coefficient of the semiconductor element, the thickness of the first conductive layer is from 0.55 times (inclusive) to 1.0 times (exclusive) the thickness of the second conductive layer.

Effect of the Invention

According to the present invention, since the thickness of the first conductive layer is from 0.5 times to 2.0 times (inclusive) the thickness of the second conductive layer, a warp amount of the semiconductor element is reduced so that the contact area between the semiconductor element and the bonding material increases when the semiconductor element is temporarily fixed on the sinterable metal bonding material. This enables the suppression of displacement of the semiconductor element on the substrate, which may occur before bonding after the semiconductor element is temporarily fixed on the sinterable metal bonding material, and a high yield can be achieved.

MODES FOR CARRYING OUT THE INVENTION

Figure 1A:
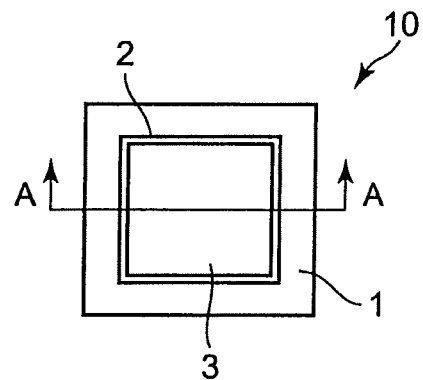
FIG. 1A is a plane view of a power module according to a first embodiment of the present invention.

A power module (or power semiconductor device) according to an embodiment of the present invention will be described with reference to the drawings. In the figures, the same or similar constituent elements are denoted by the same reference numerals.

First Embodiment

Figure 1B:
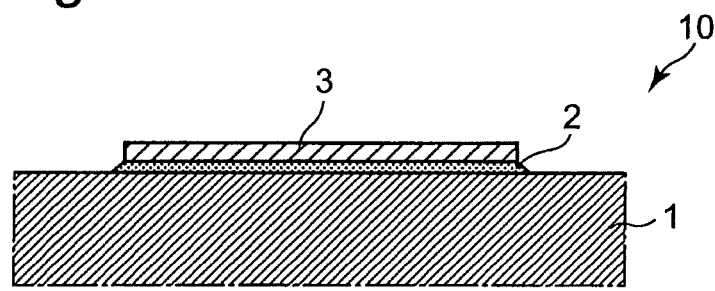
FIG. 1B is a cross-sectional view taken along a line A-A of FIG. 1A.

FIG. 1A is a plane view of a power module 10 according to a first embodiment of the present invention, and FIG. 1B is a cross-sectional view taken along a line A-A of FIG. 1A. The power module 10 includes a substrate 1, and a semiconductor element 3 bonded on the substrate 1 by using a sinterable metal bonding material 2 (i.e., disposed via a bonding layer made of a sinterable metal bonding material).

The substrate 1 may be a metal substrate of copper (Cu), aluminum (Al), etc. The substrate 1 may be a ceramic substrate in which a conductive layer using metal such as Cu and Al is laminated and fixed to an insulating ceramic of $Al_2O_3$, $Si_3N_4$, AlN, etc. The conductive layer using metal may be a single metal layer of Cu, Al, etc., or may be a metal layer further covered with a noble metal material such as silver (Ag) and gold (Au). On a surface of the substrate 1 on which the semiconductor element 3 is mounted, a substrate electrode not shown (e.g., made of a metal material) is formed.

The sinterable metal bonding material 2 is a bonding material in which metal fine particles serving as an aggregate are dispersed in an organic component into a paste form. The metal fine particles acting as an aggregate may be single metal classified as precious metal such as gold (Au), silver (Ag), copper (Cu), palladium (Pd), platinum (Pt), and nickel (Ni) or may be an alloy such as Ag—Pd, Au—Si, Au—Ge, and Au—Cu.

The sinterable metal bonding material will generally be described. The sinterable metal bonding material is a bonding material utilizing a phenomenon that metal bonding progresses due to diffusion at a temperature lower than the melting point of the metal in bulk since metal fine particles having a radius on the order of nanometers have a very large surface area and therefore have a large surface energy, resulting in high reactivity. Because of the high reactivity, the metal fine particles cause sintering, i.e., diffusion bonding, to proceed only by contact even at room temperature. This is because fine particles have a large specific surface area as compared to a bulk material and have a large surface free energy. When metal fine particles are brought into contact with each other, the surface free energy becomes smaller when the particles are diffused and integrated with each other, so that the metal fine particles aggregate by using the surface free energy as a drive force. If aggregation and a sintering reaction progress from the time of manufacturing of the metal fine particles constituting the sinterable metal bonding material before being used at a manufacturing step of the power semiconductor device 30, the sinterable metal bonding material no longer functions. Therefore, in the sinterable metal bonding material, the metal fine particles are covered with an organic protective film so as to suppress the progress of the sintering reaction due to aggregation of the metal fine particles. Additionally, the sinterable metal bonding material is retained by an organic dispersant for dispersedly retaining the metal fine particles independently of each other.

Figure 2:
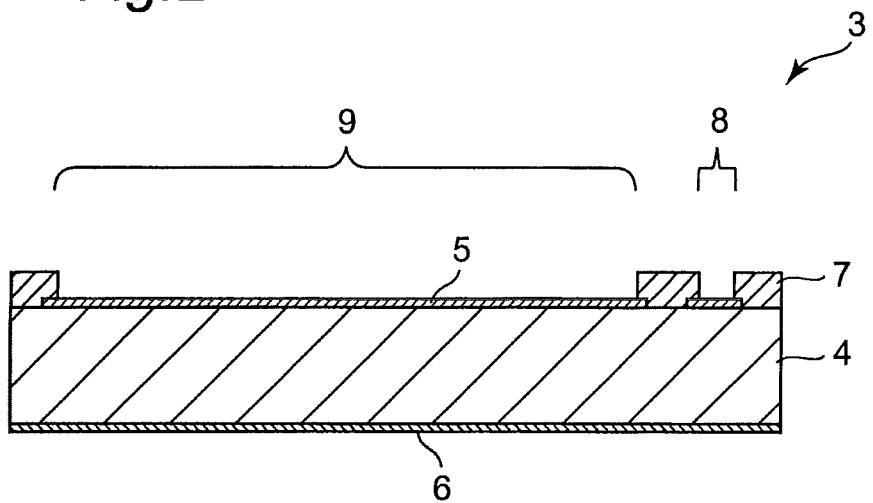
FIG. 2 is a partially enlarged view of FIG. 1B.

FIG. 2 is a partially enlarged view of FIG. 1B showing the semiconductor element 3. The semiconductor element 3 has a base 4, a front-surface metallized layer 5 (a second conductive layer) disposed on a front surface (a circuit configuration surface, a second surface) of the base 4, a rear-surface metallized layer (a first conductive layer) disposed on a rear surface (a substrate bonding surface, a first surface) of the base 4. The semiconductor element 3 may be a vertical semiconductor element, and the front-surface metallized layer 5 and the rear-surface metallized layer 6 may function as a front-surface electrode and a rear-surface electrode, respectively. The semiconductor element 3 may be a switching element such as an IGBT and a MOSFET (Metal Oxide Semiconductor Field Effect Transistor) or may be a rectifying element such as a diode. The semiconductor element 3 has a rectangular shape with a side of about 5 mm or more and about 20 mm or less in planar view, for example. Although the semiconductor element 3 is an IGBT in an example described with reference to FIG. 2, the present invention is not limited thereto.

The base 4 may be silicon (Si). The base 4 may be a so-called wide band gap semiconductor material having a wider band gap than silicon, for example, silicon carbide (SiC), gallium nitride (GaN), and diamond. When a wide bandgap semiconductor material is used as the base 4, since a power loss is reduced as compared to when silicon is used, the power module 10 can be made highly efficient and has higher voltage endurance and higher allowable current density, so that the power module 10 can be miniaturized. Furthermore, since a radiation fin, a coolant jacket allowing circulation of a coolant for cooling the radiation fin, etc. are typically attached to the power module 10, and the wide band gap semiconductor element has high heat resistance and can operate at high temperature, the radiation fin can be miniaturized, or the coolant jacket is not required, so that the power module 10 can further be miniaturized.

The material of the front-surface metallized layer 5 and the rear-surface metallized layer 6 may be an ordinary electrode material such as Al and Cu, for example, or may be an alloy material acquired by adding Si etc. in consideration of a bonding property with the base 4.

In the first embodiment, the front-surface metallized layer 5 is divided by a resist 7 so that a gate pad 8 and an emitter pad 9 are defined as a pattern. The emitter pad 9 is electrically connected to an external terminal through a wiring member (specifically, a wiring metal plate 12 shown in FIG. 8) by using, for example, an Sn—Ag—Cu—Sb-based solder material, a conductive adhesive, or a sinterable metal bonding material. The entire rear-surface metalized layer 6 functions as a collector pad and is electrically connected to a substrate electrode not shown by using the sinterable metal bonding material 2.

To suppress peeling between the front-surface metallized layer 5 and the rear-surface metallized layer 6 to improve the reliability of the power module 10, a thickness wf of the front-surface metallized layer 5 and a thickness wr of the rear-surface metallized layer 6 are preferably set to values as close as possible to each other.

As described later, a method for manufacturing the power module 10 includes a step of mounting and temporarily fixing the semiconductor element 3 onto the sinterable metal bonding material 2. To reduce a warp amount of the semiconductor element 3 to increase a contact area between the semiconductor element 3 and the bonding material 2 and thereby suppress a displacement of the semiconductor element 3 on the substrate 1, which may occur before bonding after the temporary fixation, a ratio (wr/wf) of the thickness wr of the rear-surface metallized layer 6 to the thickness wf of the front-surface metallized layer 5 is preferably set to 0.5 or more and 2 or less.

To suitably suppress peeling between the front-surface metallized layer 5 and the rear-surface metallized layer 6, the ratio (wr/wf) of the thickness wr of the rear-surface metallized layer 6 to the thickness wf of the surface metallized layer 5 is preferably 0.55 or more and 1.8 or less.

Figure 3:
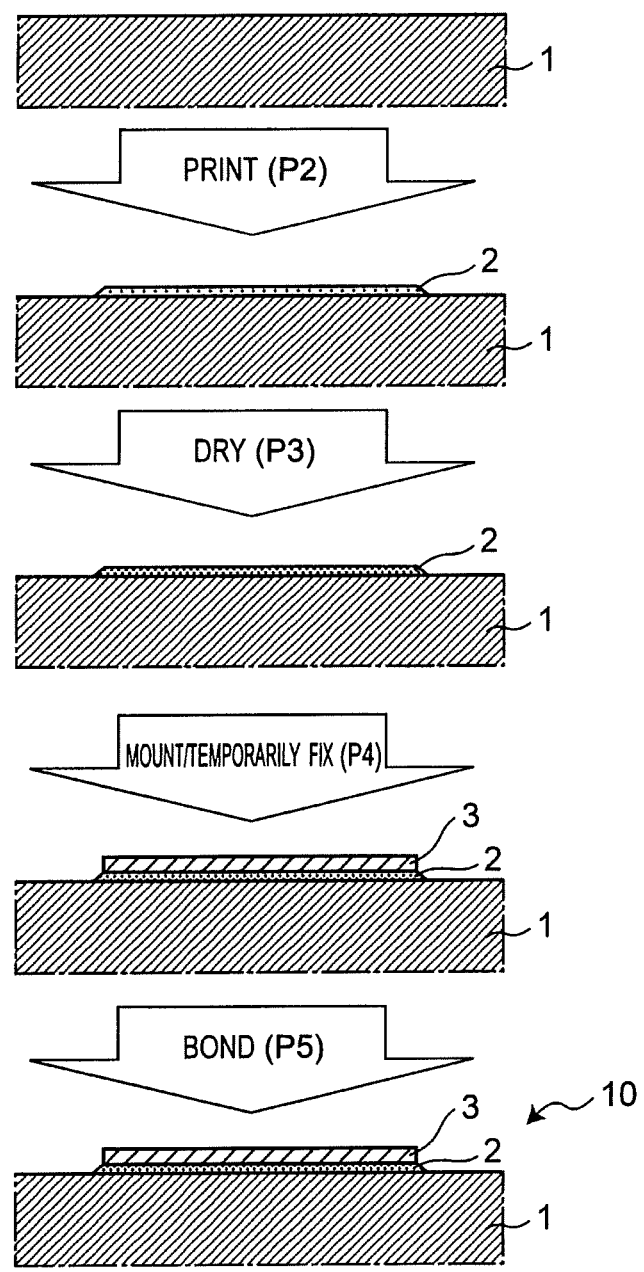
FIG. 3 is a flowchart of an exemplary method for manufacturing a power module according to the first embodiment of the present invention.

FIG. 3 is a flowchart of an exemplary method for manufacturing the power module 10 according to the first embodiment. The method for manufacturing the power module 10 includes: a step (P1) of disposing the front-surface metallized layer 5 and the rear-surface metallized layer 6 on the front surface and the rear surface, respectively, of the base 4 of the semiconductor element 3; a step (P2) of disposing the sinterable metal bonding material 2 in a paste form on the front surface of the substrate 1; a step (P3) of drying the sinterable metal bonding material 2; a step (P4) of mounting and temporarily fixing the semiconductor element 3 onto the sinterable metal bonding material 2, and a step (P5) of bonding the substrate 1 and the semiconductor element 3 by using the sinterable metal bonding material 2.

Although not shown, the manufacturing method includes a step (P6) of bonding the wiring metal plate 12 (see FIG. 8) onto the semiconductor element 3 by using a solder material or a sinterable metal bonding material, a step (P7) of bonding a frame surrounding the entire substrate to the substrate 1 by using a known adhesive, and a step (P8) of filling and curing a gel resin in the frame.

At step P1, the front-surface metallized layer 5 and the rear-surface metallized layer 6 can be disposed by a method such as vapor deposition, sputtering, and plating (electrolytic plating, electroless plating). A film acquired by sputtering is generally characterized by adhesiveness higher than a film acquired by a method such as vapor deposition. Electroless plating is generally characterized by a film forming rate higher than sputtering.

If the front-surface metallized layer 5 and the rear-surface metallized layer 6 have the same layer configuration in terms of composition, the two layers 5, 6 can be disposed at one process step. As a result, the number of process steps can be reduced to lower the manufacturing cost of the power module 10. In the example shown in FIG. 2, the front-surface metallized layer 5 is patterned to define the gate pad 8 and the emitter pad 9.

At step P2, the sinterable metal bonding material 2 may be disposed by applying the material by using a dispenser or may be disposed by a known printing method. An exemplary thickness of the sintered metal bonding material 2 to be disposed is 30 μm or more and 200 μm or less.

Generally, since decomposition of an organic component and sintering of the metal fine particles occur in the sinterable metal bonding material, a volume of a bonding portion after bonding is reduced to about a half to quarter of the volume in the paste form before bonding. Therefore, to suppress the occurrence of voids in the bonding portion, heating is preferably performed while applying a pressure at the time of bonding. From the viewpoint of suppressing the occurrence of voids in the bonding portion, preferred conditions of steps P3 and P4 will be described.

At step P3, after step (P1) of disposing the sinterable metal bonding material 2 on the substrate 1, the sinterable metal bonding material 2 is dried to remove an organic dispersant in the bonding material 2 before step (P4) of mounting and temporarily fixing the semiconductor element 3 onto the sinterable metal bonding material 2. If the semiconductor element 3 is mounted with the organic dispersant remaining, the organic dispersant volatilizing at the time of bonding may generate cavities in the bonding layer; however, execution of step P3 can suppress such generation of cavities. For example, when Au, Ag, and Cu are used as the metal fine particles, drying is preferably performed at step P3 in a temperature environment of 80° C. or more and 200° C. or less for one minute or more and six minutes or less.

The sinterable metal bonding material 2 after the removal of the organic dispersant at step P3 has a lower viscosity than a solder paste (or viscosity of substantially zero). Therefore, at step P4, the temporary fixation is performed by using smaller pressure and heating as compared to the bonding at step P5. The mechanism of this temporary fixation differs depending on the pressurizing condition and the heating condition and may be, for example, (i) adhesion with a residual solvent and a protective film volatilized by heating, (ii) bonding by partially proceeding the sintering, etc.

In the case (i), since the contact area between the semiconductor element 3 and the sinterable metal bonding material 2 greatly contributes to the adhesive force, the warp of the semiconductor element 3 is preferably as small as possible. In either case of (i) and (ii), the temperature of the semiconductor element 3 rises at the time of mounting due to heating, and the temperature of the semiconductor element 3 decreases after mounting. Therefore, if a change in warp occurs due to temperature, a stress is generated in the direction of peeling of the semiconductor element 3, causing the temporarily fixed element to peel off or the strength of the temporary fixation to decrease. Therefore, to ensure the strength of the temporary fixation, it is preferable to reduce the warp amount of the semiconductor element 3 at normal temperature and high temperature. At Step P4, preferably, the semiconductor element 3 is temporarily fixed by applying a pressure of 0.01 MPa or more and 5 MPa or less for one minute or less under a temperature environment of 25° C. or more and 200° C. or less.

At step P5, preferably, the sinterable metal bonding material 2 is sintered by applying a pressure of 0.1 MPa or more and 50 MPa or less for 1 minute or more and 60 minutes or less under a temperature environment of 250° C. or more and 350° C. or less to bond the semiconductor element 3 to the substrate 1. These conditions are illustrative.

At step P6, the wiring metal plate 12 (see FIG. 8) is bonded to the front surface of the semiconductor element 3. The bonding of the sinterable metal bonding material 2 on the rear surface of the semiconductor element 3 is already completed at step P5, and even if the temperature of the bonding portion on the front-surface side rises to, for example, about 300° C. during when solder bonding is performed, the sinterable metal bonding material 2 is not remelted on the rear-surface side. At step P6, the material used for bonding the semiconductor element 3 is not limited to the solder material and may be a conductive adhesive, a sinterable metal bonding material, etc.

At step P8, sealing is performed with a gel resin; however, the periphery of the semiconductor element 3 may be sealed by another method such as sealing by silicone potting or mold forming, or the sealing with resin may not be performed depending on product specification.

EXAMPLES

The first embodiment of the present invention will specifically be described with examples (samples S1 to S4); however, these are not limitations of the present invention. First, the substrate 1, the sinterable metal bonding material 2, and the semiconductor element 3 used in the examples will be described.

(Substrate 1)

The substrate 1 was prepared by bonding conductive layers using Cu, which is an example of a metal, to both surfaces of $Si_3N_4$, which is an example of an insulating ceramic, with a brazing material. The linear expansion coefficient of $Si_3N_4$ is about 3 ppm/° C. and the linear expansion coefficient of Cu is about 17 ppm/° C. Therefore, when a Cu plate has a larger thickness, the linear expansion coefficient of the entire substrate 1 becomes larger. To reduce a stress applied to, and a strain generated in, the semiconductor element 3 and the sinterable metal bonding material 2, the Cu plates are preferably thin. Specifically, the thickness of the Cu plate is preferably 1.0 mm or less, more preferably 0.5 mm or less. In this example, to satisfy this condition, the thickness of the $Si_3N_4$ plate was set to 0.3 mm and the thickness of the Cu plate was set to 0.8 mm. The substrate has a three-layer structure in which a Cu layer of 0.8 mm in thickness, an $Si_3N_4$ layer of 0.3 mm in thickness, and a Cu layer of 0.8 mm in thickness are laminated in this order. The substrate has the equivalent linear expansion coefficient of 12 (ppm/K) and the equivalent elastic modulus of 150 GPa.

(Sinterable Metal Bonding Material 2)

A sinterable silver (Ag) paste was used as the sinterable metal bonding material 2. The sinterable silver (Ag) paste was bonded within the ranges of the drying condition, the mounting condition, and the bonding condition.

(Semiconductor Element 3)

Silicon (Si) was used as the material of the semiconductor element 3. The semiconductor element 3 had the dimensions of 15 mm×15 mm and the thickness of 0.15 mm. The layer structure of both the front-surface metallized layer 5 and the rear-surface metallized layer 6 was AlSi layer/Ti layer/Ni layer/Au layer from the base side. Since the front-surface metallized layer 5 and the rear-surface metallized layer 6 have the same layer structure, the two layers 5, 6 are disposed at the same time at one process step. In the samples S1 to S4, the ratio (wr/wf) of the thickness wr of the rear-surface metallized layer 6 to the thickness wf of the front-surface metallized layer 5 was varied as follows. It is noted that the front-surface metallized layer 5 and the rear-surface metallized layer 6 are different only in the thickness of the Ni layer and that the thicknesses of the AlSi layer, the Ti layer, and the Au layer are the same and sufficiently small as compared to the thickness of the Ni layer.

Sample S1: wr/wf=1.0 μm/1.7 μm=0.17
Sample S2: wr/wf=1.8 μm/9.0 μm=0.20
Sample S3: wr/wf=4.4 μm/8.0 μm=0.55
Sample S4: wr/wf=4.6 μm/7.0 μm≈0.65

A heat cycle test was performed on the samples S1 to S4 of the power module 10. The heat cycle test was performed by putting the power module 10 in a thermal shock tester (TSD-100 manufactured by ESPEC) and repeatedly increasing/decreasing a temperature inside a high-temperature tank between −40° C. and 150° C. After performing the heat cycle (H/C) test for 2000 cycles (15 minutes) considered as practical durability, a determination was made on the presence/absence of peeling of the rear-surface metallized layer 6. The presence/absence of peeling was determined through observation with an ultrasonic imaging apparatus (FineSAT manufactured by Hitachi Engineering & Services).

The test results of the heat cycle test are shown in the following table.

TABLE 1

| | sample | | | |
|---|---|---|---|---|
| | S1 | S2 | S3 | S4 |
| thickness wf of front-surface metallized layer 5 (μm) | 10 | 9.0 | 8.0 | 7.0 |
| thickness wr of rear-surface metallized layer 6 (μm) | 1.7 | 1.8 | 4.4 | 4.6 |
| wr/wf | 0.17 | 0.20 | 0.55 | 0.65 |
| peeling of rear-surface metallized layer 6 | peeled | peeled | not peeled | not peeled |

When the ratio (wr/wf) of the thickness wr of the rear-surface metallized layer 6 to the thickness wf of the front-surface metallized layer 5 is 0.17 (sample S1) and 0.20 (sample S2), the rear-surface metallized layer 6 was peeled. On the other hand, when the ratio (wr/wf) was 0.55 (sample S3) and 0.65 (sample S4) the rear-surface metallized layer 6 was not peeled. Therefore, it can be said that when the ratio (wr/wf) is 0.55 or more, sufficient peeling resistance is obtained for the rear-surface metallized layer 6.

Figure 4:
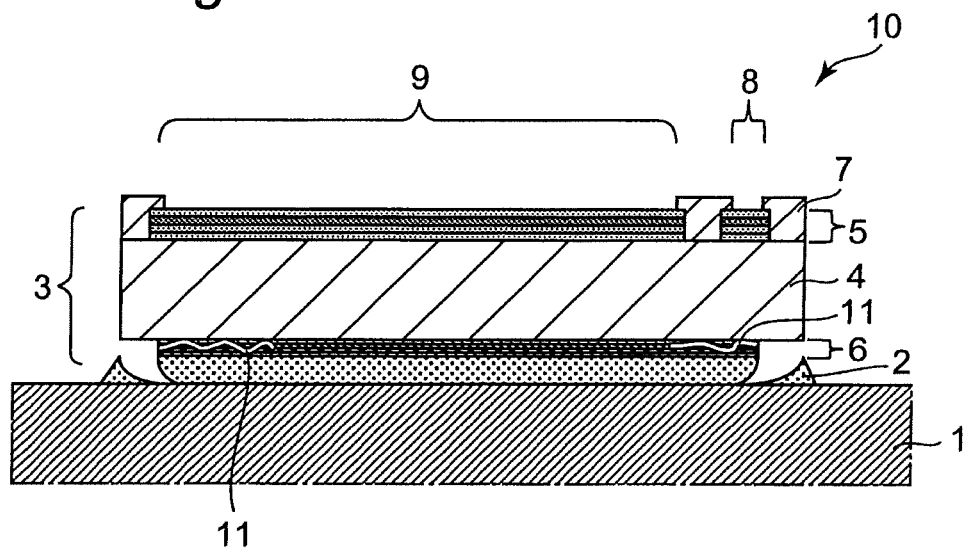
FIG. 4 is a diagram of a heat cycle test result for a sample S1 of the power module.

FIG. 4 is a schematic of a result of observation of the presence/absence of peeling of the rear-surface metallized layer 6 in the sample S1 of the power module 10. It can be seen that a crack 11 is developed in the rear-surface metallized layer 6 after the heat cycle test. It is thought that the crack 11 is developed as follows. First, since the rear-surface metallized layer 6 is extremely thin as compared to the front-surface metallized layer 5, a thermal stress concentrates on an end portion of the rear-surface metallized layer 6 as the heat cycle test progresses so that a crack is developed in the sinterable metal bonding material 2 at the end portion, and the rear-surface metallized layer 6 (AlSi layer) then shrinks so that the crack is subsequently developed in the AlSi layer. Since the crack 11 is developed as an interfacial peeling in the rear-surface metallized layer 6, it is difficult to predict a peeling development behavior, which causes a problem that designing of a life is difficult.

Figure 5:
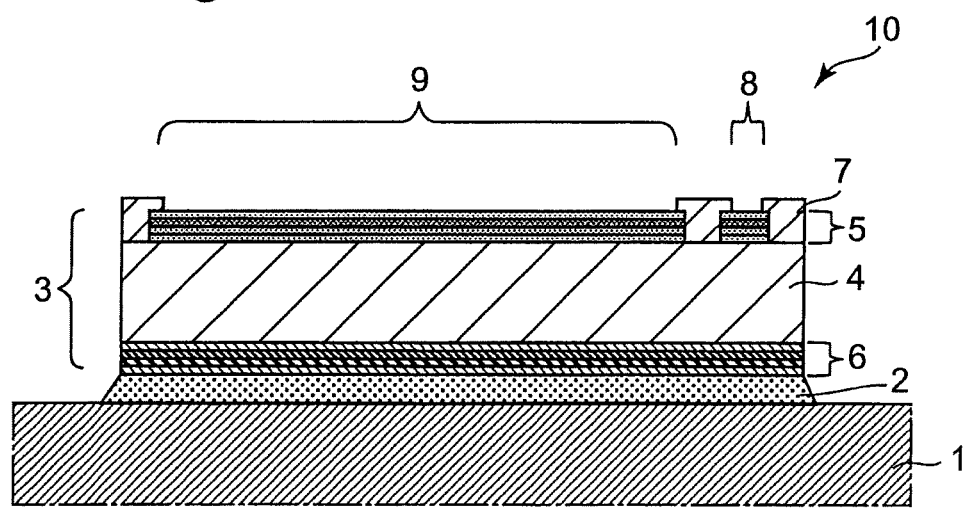
FIG. 5 is a diagram of a heat cycle test result for a sample S4 of the power module.

FIG. 5 is a schematic of a result of observation of the presence/absence of peeling of the rear-surface metallized layer 6 in the sample S4 of the power module 10.

After the heat cycle test, no crack is generated in the sinterable metal bonding material 2 or the rear-surface metallized layer 6.

Although the thickness wr of the rear-surface metallized layer 6 was smaller than the thickness wf of the front-surface metallized layer 5 in the heat cycle test performed in the example, conversely, if the thickness wr of the rear-surface metallized layer 6 is smaller than the thickness wf of the front-surface metallized layer 5, a thermal stress concentrates on the end portion of the front-surface metallized layer 5 bonded to the wiring metal plate 12 (see FIG. 8) as the heat cycle test progresses. It can be expected that a crack is developed in the sinterable metal bonding material 2 at the end portion, that the front-surface metallized layer 5 (AlSi layer) then shrinks, and that the crack is subsequently developed in the AlSi layer. Therefore, similar to the rear-surface metallized layer 6 side, if the wiring metal plate 12 exhibiting the linear expansion coefficient and the longitudinal elastic modulus equivalent to those of the front-surface metallized layer 5 and the substrate is bonded with the sinterable metal bonding material 2, the upper limit value of the ratio (wr/wf) of the thickness wr to the thickness wf for obtaining sufficient peeling resistance for the front-surface metallized layer 5 is 1.8, which is the reciprocal of 0.55. In the case of solder bonding of the front-surface metallized layer 5 and the wiring metal plate 12, when an amount of strain applied to the front-surface metallized layer 5 side is reduced due to a structure of the wiring metal plate 12 and a small bonding area, the upper limit value of the ratio (wr/wf) of the thickness wr to the thickness wf is 1.8× (reciprocal of a strain amount reduction rate).

As described above, by setting the ratio (wr/wf) of the thickness wr of the rear-surface metallized layer 6 to the thickness wf of the front-surface metallized layer 5 to 0.55 or more and 1.8 or less, the thermal stress repeatedly applied to the bonding portion of the semiconductor element 3 due to the operation of the power module 10 can be reduced to sufficiently suppress the peeling between the front-surface metallized layer 5 and the rear-surface metallized layer 6, thereby improving the reliability of the power module 10.

Although the front-surface metallized layer 5 and the rear-surface metallized layer 6 each have a multilayer structure in the heat cycle test performed in the example, the same result is obtained when the heat cycle test performed in an example in which the front-surface metallized layer 5 and the rear-surface metallized layer 6 each have a single layer structure.

However, in the case of the front-surface metallized layer 5 and the rear-surface metallized layer 6 each having a single layer structure, if the front-surface metallized layer 5 and the rear-surface metallized layer 6 have different values of the linear expansion coefficient and the longitudinal elastic modulus, these values are preferably taken into consideration when the range of the ratio (wr/wf) of the thickness wr to the thickness wf is obtained for achieving sufficient peeling resistance for the front-surface metallized layer 5 and the rear-surface metallized layer 6. As a result, the accuracy for the range of the ratio (wr/wf) can be improved.

Specifically, in the case of the front-surface metallized layer 5 and the rear-surface metallized layer 6 each having a single layer structure, when the front-surface metallized layer 5 has a linear expansion coefficient of and a longitudinal elastic modulus Ef, and the rear-surface metallized layer 6 has a linear expansion coefficient ar and a longitudinal elastic modulus Er, the lower limit value can be calculated in terms of the ratio (wr/wf) of the thickness wr to the thickness wf for achieving sufficient peeling resistance for the front-surface metallized layer 5 and the rear-surface metallized layer 6 by following Eq. (1).

$$0.55 \times (\alpha_f \times E_f / \alpha_r \times E_r) \quad (1)$$

The upper limit value can be calculated by following Eq. (2).

$$1.8/(\alpha_f \times E_f / \alpha_r \times E_r) \quad (2)$$

For example, if the front-surface metallized layer 5 and rear-surface metallized layer 6 have the same thickness, αf of 12 (ppm/K), Ef of 125 (GPa), ar of 10 (ppm/K), and Er of 100 (GPa), the ratio (wr/wf) is preferably 0.83{=0.55× (12×125/10×100)} or more and 1.2{=1.8/(12×125/10×100)} or less.

In the case of the front-surface metallized layer 5 and the rear-surface metallized layer 6 each having a multilayer structure, a preferable range of the ratio (wr/wf) can be obtained by replacing the linear expansion coefficients αf, ar with respective equivalent linear expansion coefficients and the longitudinal elastic moduli Ef, Er with respective equivalent longitudinal elastic moduli.

When the front-surface metallized layer 5 or the rear-surface metallized layer 6 has a multilayer structure (L1, L2, L3 . . . ) with respective layers having linear expansion coefficients of α1, α2, α3 . . . , longitudinal elastic moduli E1, E2, E3 . . . , and thicknesses t1, t2, t3 . . . , an equivalent linear expansion coefficient αs can be calculated by following Eq. (3).

$$\alpha_s = \{(\alpha_1 \times E_1 \times t_1) + (\alpha_2 \times E_2 \times t_2) + (\alpha_3 \times E_3 \times t_3) \ldots \}/ \{(E_1 \times t_1) + (E_2 \times t_2) + (E_3 \times t_3) + \ldots \} \quad (3)$$

An equivalent longitudinal elastic modulus Es can be calculated by following Eq. (4).

$$Es = \{(E_1 \times t_1) + (E_2 \times t_2) + (E_3 \times t_3) + \ldots \}/(t_1 + t_2 + t_3) + \ldots \} \quad (4)$$

Even when the front-surface metallized layer 5 and the rear-surface metallized layer 6 each have a two-layer structure or a layer structure having four or more layers, a preferable range of the ratio (wr/wf) can be obtained by using Eqs. (1) to (4). Numerical analysis different from Eqs. (1) to (4) may be used. Furthermore, (i) when the substrate 1 is changed to a member having the linear expansion coefficient and the longitudinal elastic modulus different from the linear expansion coefficient and longitudinal elastic modulus shown in the example, (ii) when the layer configuration of the substrate 1 becomes multiple, and (iii) when the thickness is changed, the equivalent linear expansion coefficient and the equivalent longitudinal elastic modulus can be calculated by using Eqs. (3) and (4) as in the metallized layers 5, 6. By setting a strain amount ε1 after substrate change obtained by numerical analysis based on these values and a strain amount E2 in the substrate 1 shown in this example to the same value, a preferable range of the ratio (wr/wf) of the thickness wr to the thickness wf can be obtained.

Second Embodiment

Figure 6:
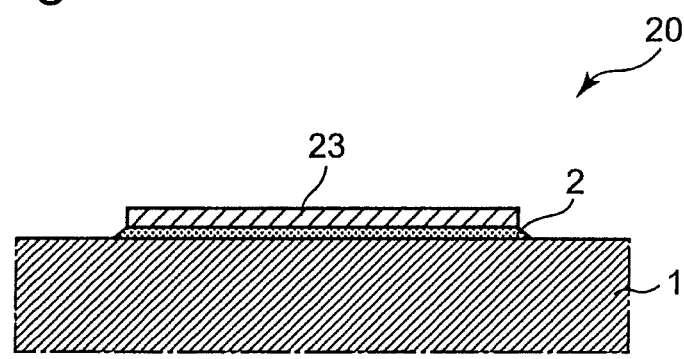
FIG. 6 is a cross-sectional view corresponding to FIG. 1B showing a power module according to a second embodiment of the present invention.
Figure 7:
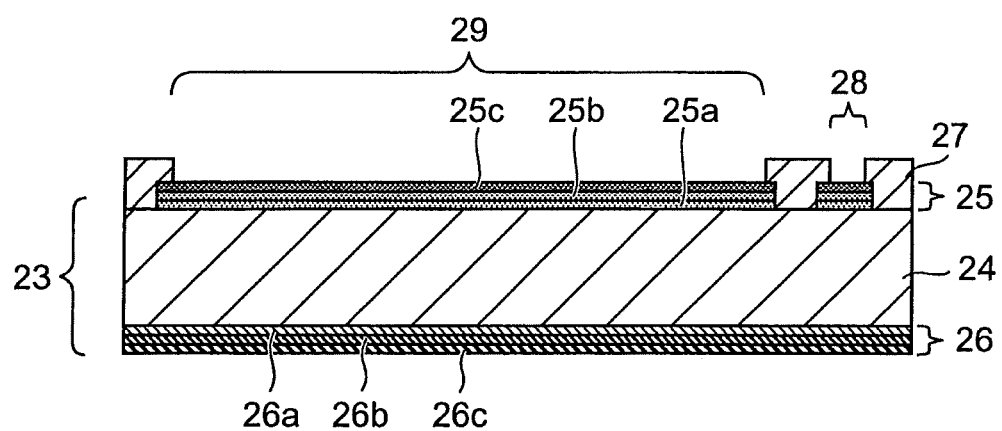
FIG. 7 is a partially enlarged view of FIG. 6.

FIG. 6 is a cross-sectional view of a power module 20 according to a second embodiment of the present invention, corresponding to FIG. 1B. FIG. 7 is a partially enlarged view of FIG. 6. In the example described in the first embodiment, the front-surface metallized layer 5 and the rear-surface metallized layer 6 of the semiconductor element 3 each have a single layer structure. In the second embodiment, description will be made of an example of a front-surface metallized layer and a rear-surface metallized layer 26 each having a multilayer structure, and respective preferable layer configurations will be discussed. Excluding the layer configurations of the front-surface metallized layer and the rear-surface metallized layer of the semiconductor element, the power module 20 of the second embodiment has the same or corresponding constituent elements as the power module 10 of the first embodiment. These constituent elements are denoted by the same reference numerals in the description and the drawings and will not be described in detail. Although a semiconductor element 23 is an IGBT in the example described with reference to FIG. 7, the present invention is not limited thereto.

The power module 20 includes the substrate 1 and the semiconductor element 23 bonded on the substrate 1 by using a sinterable metal bonding material 2. The semiconductor element 23 has abase 24, the front-surface metallized layer 25 disposed on a front surface of the base 24, and the rear-surface metallized layer 26 disposed on a rear surface of the base 24. For the material of the base 24, the material of the base 4 described in the first embodiment can be used, and a silicon-based material (such as silicon and silicon carbide) is used in the following description.

The front-surface metallized layer 25 is divided by a resist 27 so that a gate pad 28 and an emitter pad 29 are defined. The emitter pad 29 is electrically connected to an external terminal not shown by using a solder material, for example, and the rear-surface metallized layer 26 functions as a collector pad and is electrically connected to a substrate electrode not shown by using the sinterable metal bonding material 2. The gate pad 28 is not solder-bonded.

The front-surface metallized layer 25 has a three-layer structure (25a, 25b, 25c), and the rear-surface metallized layer 26 also has a three-layer structure (26a, 26b, 26c).

In the metallized layers 25, 26 of the semiconductor element 3, preferable layer configurations differ depending on what bonding means is used to form a circuit. In the example described in the second embodiment, the solder bonding is performed on the front surface of the semiconductor element 23 and the sinterable metal bonding is performed on the rear surface.

The three-layer structure of the front-surface metallized layer 25 has the AlSi layer 25a, the Ni layer 25b, and the Au layer 25c from the base 24 side. The AlSi layer 25a is made of an AlSi alloy acquired by adding silicon to aluminum and has a function of improving the adhesion between the base 24 of the silicon-based material and the front-surface metallized layer 25. A similar function is achieved also when an alloy acquired by adding Si to another metal material is used instead of AlSi. The Ni layer 25b has a function of enhancing a bondability to the solder material and functions also as a barrier layer of an intermetallic compound. The Au layer 25c has a function of preventing oxidation of the outermost surface and improving the wettability of the solder material.

When the front-surface metallized layer 25 and the wiring metal plate 12 (see FIG. 8) are solder-bonded and when the front-surface metallized layer 25 is subsequently exposed to a high temperature, the Ni layer 25b etc. tend to diffuse into tin (Sn) contained in the solder material, so that the thickness of the Ni layer 25b is preferably increased (e.g., to about 2 μm or more and about 10 μm or less) to prevent the Ni layer 25b from completely disappearing due to the diffusion.

The layer structure of the rear-surface metallized layer 26 has the AlSi layer 26a, the Ti layer 26b, and the Au layer 26c from the base 24 side. The AlSi layer 26a has the function of improving the adhesion between the base 24 of the Si-based material and the front-surface metallized layer 25 as in the description of the AlSi layer 25a of the front-surface metallized layer 25. The Ti layer 26b has a function of improving the adhesion between the AlSi layer 26a and the Au layer 26c. The Au layer 26c diffuses together with the metal fine particles contained in the sinterable metal bonding material 2 and has a function of assisting the sinterable metal bonding.

The rear-surface metallized layer 26 may include a Ni layer high in strength and hardness in addition to or instead of the Ti layer 26b. In this case, to reinforce the rear-surface metallized layer 26, the thickness of the Ni layer is preferably 1.5 μm or more. By setting the thickness of the Ni layer to 1.15 times or more of the thickness of the AlSi layer 26a having a lower strength, the effect of reinforcing the rear-surface metallized layer 26 can be enhanced.

In the second embodiment, as in the first embodiment, the thickness wf of the front-surface metallized layer 25 and the thickness wr of the rear-surface metallized layer 26 are preferably set to values as close as possible to each other to suppress peeling of the rear-surface metallized layer 26 to improve the reliability of the power module 20. To suitably suppress the peeling between the front-surface metallized layer 25 and the rear-surface metallized layer 26, the ratio (wr/wf) of the thickness wr of the rear-surface metallized layer 26 to the thickness wf of the front-surface metallized layer 25 is set to 0.55 or more and 1.8 or less.

The Au layer 26c of the rear-surface metallized layer 26 does not disappear at the bonding step and the subsequent steps and therefore preferably has the thickness sufficiently reduced for cost reduction as compared to the thickness exemplified for the Ni layer 25b of the front-surface metallized layer 25.

In the front-surface metallized layer 25 and the rear-surface metallized layer 26, the AlSi layers 25a, 26a are usually disposed at the same time and can be set to the same thickness. As described above, the Au layer 26c of the rear-surface metallized layer 26 is preferably made thinner for cost reduction. As described above, the Ni layer 25b is preferably made thicker to prevent disappearance due to diffusion. If the front-surface metallized layer 25 and the rear-surface metallized layer 26 have the layer structure in this way, the thickness wf of the front-surface metallized layer tends to become larger than the thickness wr of the rear-surface metallized layer 26. Therefore, a Ni layer having the same level of thickness as the Ni layer 25b of the front-surface metallized layer 25 may be disposed between the Ti layer 26b and the Au layer 26c in the rear-surface metallized layer 26.

A simple and effective method of equalizing the thicknesses of the front-surface metallized layer 25 and the rear-surface metallized layer 26 is a method of simultaneously plating the front and rear surfaces of the semiconductor element 23, for example, an electrolytic nickel plating method. In this case, the layer structure of the rear-surface metallized layer 26 can be the AlSi layer/Ni layer/Au layer as in the front-surface metallized layer 25.

For this example, a sample S5 of the power module 20 was manufactured to perform the heat cycle test described in the first embodiment. The sample S5 had the layer structure of the AlSi layer/Ni layer/Au layer in both the front-surface metallized layer 25 and the rear-surface metallized layer 26 of the semiconductor element 23 with the AlSi layer having the thickness of 1.3 μm, the Ni layer having the thickness of 1.5 μm, and the Au layer having the thickness of 0.05 μm. Therefore, the ratio (wr/wf) of the thickness wr of the rear-surface metallized layer 6 to the thickness wf of the front-surface metallized layer 5 was 1.0. A sinterable silver (Ag) paste was used as a sinterable metal bonding material. After the heat cycle test, the rear-surface metallized layer 26 was not peeled.

In the second embodiment, by forming each of the front-surface metallized layer 25 and the rear-surface metallized layer 26 as a multilayer structure, a suitable layer configuration can be selected depending on a bonding method and, conversely, options for the bonding method are increased by selecting the layer configuration, so that the bonding method with low costs and high productivity can be selected, for example.

As described above, if the front-surface metallized layer 25 is solder-bonded, the Ni layer 25b etc. diffuse into Sn and become thinner. Therefore, the thickness of the metallized layer 25 of the semiconductor element 23 before bonding cannot be measured by using the emitter pad 29 that is solder-bonded. Therefore, the thickness of the front-surface metallized layer 25 is preferably measured by using the gate pad 28 etc. that are not solder-bonded.

If compositions (or kinds) are different between the metal of the rear-surface metallized layer 26 and the metal of the sinterable metal bonding material 2, the thickness of the rear-surface metallized layer 26 can be measured through elemental analysis. On the other hand, when the metal of the rear-surface metallized layer 26 and the metal of the sinterable metal bonding material 2 have the same or similar compositions, it may be difficult to make a distinction therebetween by a bonding surface. However, the semiconductor element has a kind of a burr (sometimes referred to as whisker) of the metallized layer generated at the time of cutting (dicing) on the outer side relative to the bonding surface. Since the whisker is not in contact with the sinterable metal bonding material, the thickness of the rear-surface metallized layer 26 can be measured by detecting the position of the whisker.

In the example described in the second embodiment, both the front-surface metallized layer 25 and the rear-surface metallized layer 26 have the three-layer structure. However, the number of the layers constituting each of the front-surface metallized layer 25 and the rear-surface metallized layer 26 is not limited thereto, and the layers may each have a layer structure composed of two layers or four or more layers, for example. The front-surface metallized layer 25 and the rear-surface metallized layer 26 may be different in the number of layers constituting the layer structure. Even in these cases, by setting the ratio (wr/wf) of the thickness wr of the rear-surface metallized layer 26 to the thickness wf of the front-surface metallized layer 25 to 0.55 or more and 1.8 or less, the effects described in the second embodiment can be obtained.

Third Embodiment

Figure 8A:
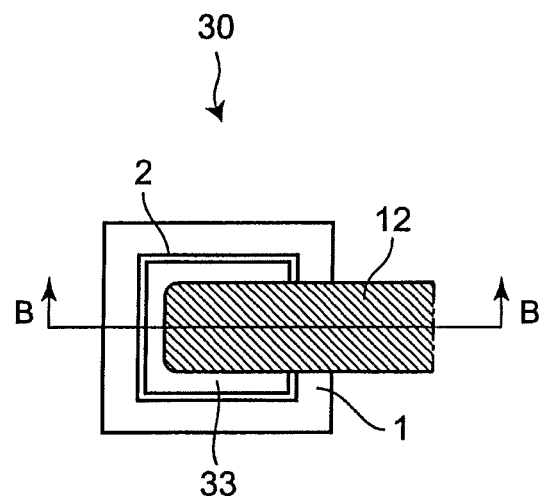
FIG. 8A is a plane view of a power module according to a third embodiment of the present invention.
Figure 8B:
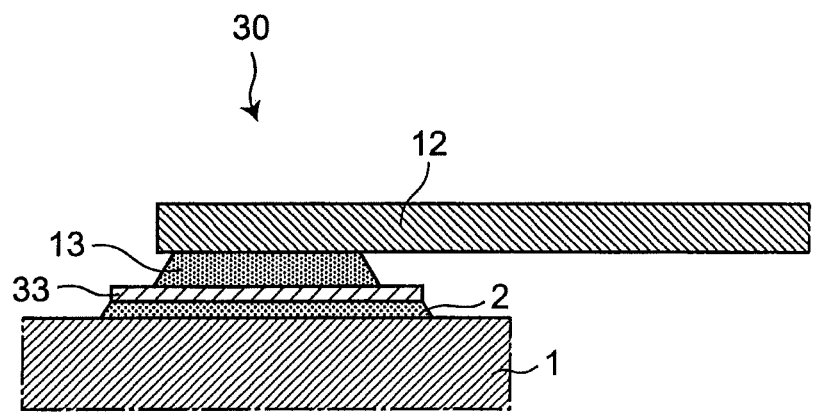
FIG. 8B is a cross-sectional view taken along a line B-B of FIG. 8A.
Figure 9:
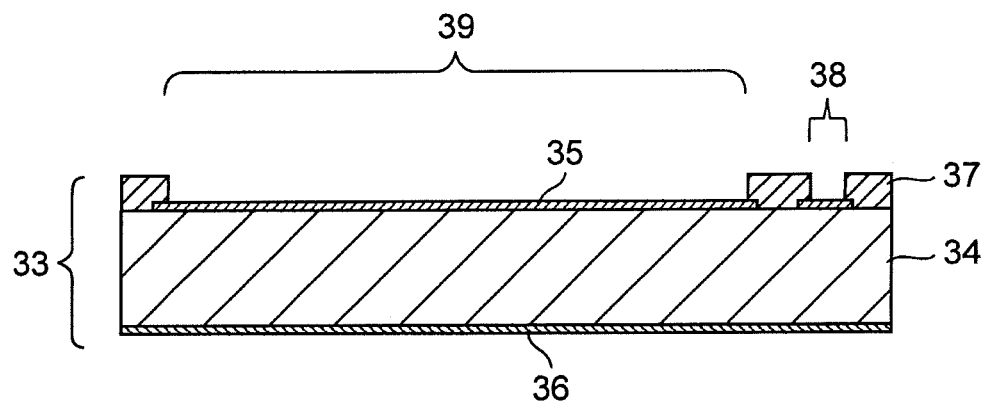
FIG. 9 is a partially enlarged view of FIG. 8B.

FIG. 8A is a plane view of a power module 30 according to a third embodiment of the present invention, and FIG. 8B is a cross-sectional view taken along a line B-B of FIG. 8A. FIG. 9 is a partially enlarged view of FIG. 8B. Excluding the layer configuration of the metallized layers on the front and rear surfaces of the semiconductor element, the power module 30 of the third embodiment has the same or corresponding constituent elements as the power module 10 of the first embodiment. These constituent elements are denoted by the same reference numerals in the description and the drawings and will not be described in detail.

The power module 30 includes the substrate 1 and a semiconductor element 33 bonded on the substrate 1 by using the sinterable metal bonding material 2. On the semiconductor element 33, the wiring metal plate 12 is bonded by using a solder material 13. The semiconductor element 33 has a base 34, a front-surface metallized layer 35 (the second conductive layer) disposed on a front surface (the circuit configuration surface, the second surface) of the base 4, a rear-surface metallized layer 36 (the first conductive layer) disposed on a rear surface (the substrate bonding surface, the first surface) of the base 34. For the material of the base 34, the material of the base 4 described in the first embodiment can be used. The thickness of the base 34 is preferably 150 µm or less.

The front-surface metallized layer 35 is divided by a resist 37 so that a gate pad 38 and an emitter pad 39 are defined. The emitter pad 39 is electrically connected to an external terminal not shown by using a solder material, for example, and the rear-surface metallized layer 36 functions as a collector pad and is electrically connected to a substrate electrode not shown by using the sinterable metal bonding material 2. The gate pad 38 is not solder-bonded.

Both the front-surface metallized layer 35 and the rear-surface metallized layer 36 are mainly composed of Ni. To reduce a warp amount of the semiconductor element 33 to increase the contact area between the semiconductor element 33 and the sinterable metal bonding material 2 and thereby suppress a displacement of the semiconductor element 33 on the substrate 1, which may occur before bonding after the temporary fixation, a ratio of the Ni layer of the rear-surface metallized layer 36 to the Ni layer of the front-surface metallized layer 35 is preferably set to 0.5 or more and 2 or less. The thickness of the Ni layer of the front-surface metallized layer 35 is preferably 1.5 µm or more as described later.

The material of the wiring metal plate 12 may be selected from the group consisting of Cu, Al, Ni, Fe, and an alloy of these metals or a laminate of these metals (i.e., a clad material). The wiring metal plate 12 may be subjected to Cu metallization and Ni metallization as needed.

The power module 30 can be manufactured by the exemplary manufacturing method described in the first embodiment. The wiring metal plate 12 may be solder-bonded to the front-surface metallized layer 5 after sinter bonding between the rear-surface metallized layer 36 of the semiconductor element 33 and the substrate 1 with the sinterable metal bonding material 2. Description will be made of effects obtained by using the sinterable metal bonding material for bonding between the substrate 1 and the semiconductor element 33 and using the solder material for bonding between the semiconductor element 3 and the wiring metal plate 12 in this way.

As described above, the bonding layer bonded by the sinterable metal bonding material 2 has a melting point rising to the melting point of the original metal material and is not remelted at the time of solder bonding between the semiconductor element 3 and the wiring metal plate 12. This eliminates the need for considering the movement of the semiconductor element 3, so that a jig can be prevented from becoming complicated. If the substrate 1 and the semiconductor element 33 are solder-bonded, the bonding layer between the substrate 1 and the semiconductor element 33 is exposed to a high temperature for a long time, which may result in deterioration of the bonding layer; however, such a problem does not occur in the third embodiment.

The effect obtained from the third embodiment will more specifically be described. Patent Document 4 (Japanese Laid-Open Patent Publication No. 2000-188406) discloses an example in which a Ni layer is disposed as a metallized layer on both surfaces of a semiconductor element. The semiconductor element has a base (made of SiC) of 300 µm in thickness and the Ni layer of 0.2 µm in thickness. In the case of such a thin Ni layer, even if the front and rear metallized layers are different in thickness of the Ni layer, the difference in the thickness has little influence on the warp of the semiconductor device. However, in the case of using the solder bonding, such a thin Ni layer causes trouble, so that the thickness of the Ni layer is preferably set to 1.5 µm or more as described below.

When exposed to a high temperature at the time of solder bonding, the metallized layers of the semiconductor element diffuse into the solder material and tend to form an intermetallic compound. The intermetallic compound is fragile and easily destroyed in a compound layer when grown. Therefore, it is generally considered that growth of the intermetallic compound is not preferable. Significant formation and growth of the intermetallic compound also cause occurrence of Kirkendall voids, electrode metal leaching (erosion), concentration of specific components, and peeling due to disappearance of a metallized layer, and results in deterioration of the bonding portion. Ni is less reactive and capable of suppress the growth of the compound layer and is often selected as the material constituting the metallized layers. However, even in the Ni layer, since a temperature of a bonded body becomes high at the time of solder bonding and the temperature of the bonded body becomes high due to heat generation from the semiconductor element when the power module is operated, the intermetallic compound still grows.

Regarding this problem, it is effective to make the Ni layer thicker. It is known that the Ni layer preferably has a thickness of 1.5 µm or more for suppression of the growth of the intermetallic compound at the time of solder bonding. On the other hand, in the case of the sinterable metal bonding, a metal diffusion range is narrower as compared to the solder bonding, and it is not necessary to make the metallized layers thicker. On the contrary, if the metallized layers are made thicker, a processing time and a necessary material increase so that costs are disadvantageously increased. Therefore, the thickness of the metallized layers is generally set to about 0.5 µm.

In this way, when the bonding method is different between the front surface and the rear surface of the semiconductor element, and the thickness of the metallized layers is determined without considering warp of the semiconductor element, a difference in thickness occurs between the front and rear metallized layers of the semiconductor element and the warp occurs. In this regard, the warp can be reduced by adjusting the thickness of the metallized layers such that the difference in thickness is made smaller between the front and rear metallized layers.

For the warp, the thickness of the base of the semiconductor element is also an important factor. Conventionally, a semiconductor element with a thick base (e.g., about 300 µm) is often used; however, a semiconductor element with a thinner base may be used in products with low voltage so as to reduce a power loss. The warp tends to become larger in a semiconductor element with a thin base. It is known that the warp is liable to increase in a semiconductor element with a thin base (e.g., 150 µm or less).

Example

The third embodiment of the present invention will specifically be described with an example; however, this is not a limitation of the present invention. In a graph of FIG. 10, the horizontal axis represents the ratio of the thickness of the rear-surface metallized layer 36 to the thickness of the front-surface metallized layer 35, and the vertical axis represents a warp amount of the semiconductor element 33.

Figure 10:
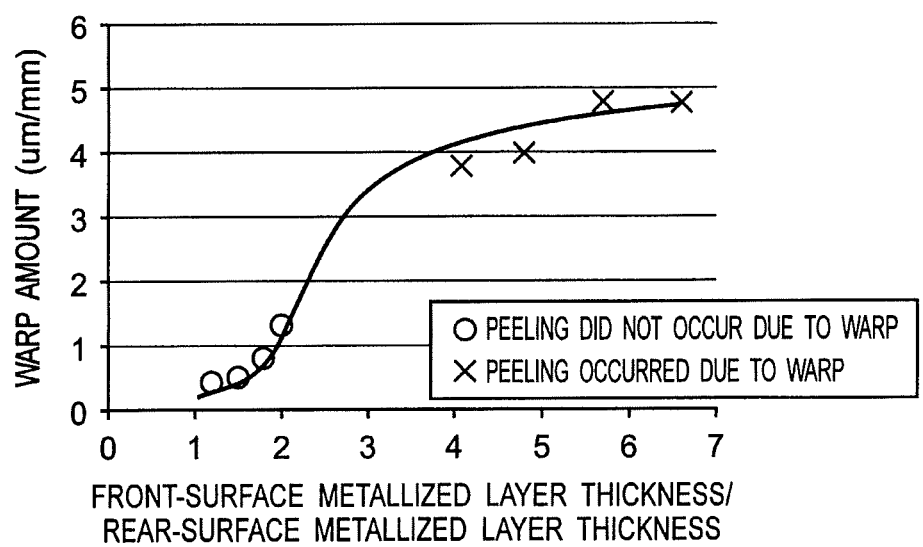
FIG. 10 is a diagram for explaining the effects according to the third embodiment of the present invention.

The graph of FIG. 10 is obtained by evaluation using the semiconductor element 33 having a planar size of 8 mm square or more and 13 mm square or less when the base 34 of the semiconductor element 33 has a thickness of 80 µm or more and 150 µm or less and the metallized layers 35, 36 mainly made of Ni have a thickness of 0.7 µm or more and 3 µm. It is known that a graph equivalent to FIG. 10 can be obtained even when these values are changed within the described ranges. The metallized layers 35, 36 of the semiconductor element 33 have an Au layer, a Ti layer and an AlSi layer in addition to the Ni layer.

Referring to FIG. 10, when the ratio of the thickness of the Ni layer of the rear-surface metallized layer 36 to the thickness of the Ni layer of the front-surface metallized layer 35 is 2.0 or less, a warp amount of the semiconductor element 33 is small and a change in warp amount (i.e., a gradient of the graph) is also small. Actually, in this range, the semiconductor element 33 was not peeled from the substrate 1 after the temporary fixation step (indicated by white circles in the graph). This is thought to be because a large influence is exerted by the elasticity of the material such as silicon serving as the base 34 of the semiconductor element 33 and a small influence is exerted on the warp amount by the difference in the thickness of the metallized layers 35, 36 on the front and rear surfaces.

When the ratio of the thickness of the Ni layer included in the metallized layers 35, 36 on the front and rear surfaces exceeds 2.0, the warp amount was increased and the semiconductor element 33 was peeled after the temporary fixation step (indicated by cross marks in the graph). This is thought to be because the difference in the thickness of the Ni layers of the metallized layers 35, 36 becomes larger and the influence thereof significantly appears.

The above results reveal that an inflection point exists in the warp amount of the semiconductor element 33 depending on the ratio of the thickness of the Ni layer included in the metallized layers 35, 36 on the front and rear surfaces, that the ratio of the thickness within 2.0 can suppress the warp amount of the semiconductor element 33 to a small amount, and that the peeling of the semiconductor element 33 after temporary fixation can thereby prevented. It is thought that the influence of the Ni layer is large in the metallized layers 35, 36 on the front and rear surfaces because Ni has a Young's modulus larger than the other metals among the metals constituting the metallized layers 35, 36.

Fourth Embodiment

Figure 11:
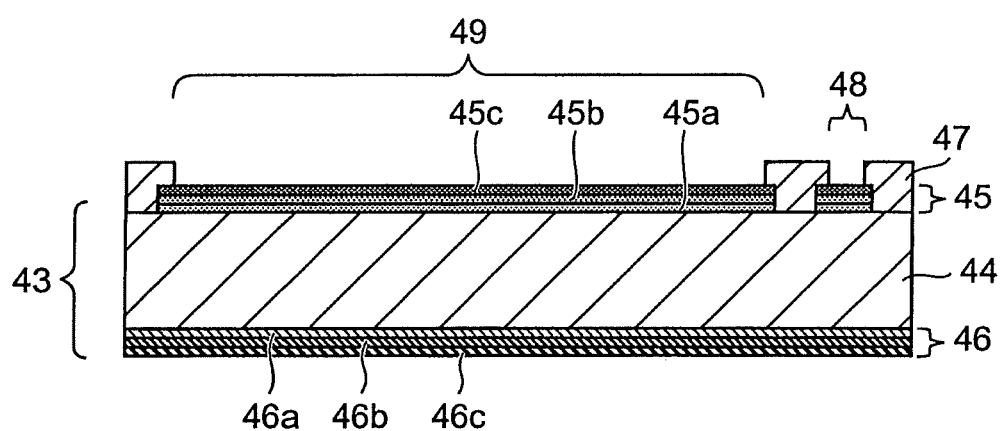
FIG. 11 is a cross-sectional view of a semiconductor element included in a power module according to a fourth embodiment of the present invention, corresponding to FIG. 9.

FIG. 11 is a cross-sectional view of a semiconductor element 43 mounted on a power module according to a fourth embodiment of the present invention, corresponding to FIG. 9. In the example described in the third embodiment, the front-surface metallized layer 35 and the rear-surface metallized layer 36 of the semiconductor element 33 each have a single layer structure. In the fourth embodiment, description will be made of an example of a front-surface metallized layer 45 and a rear-surface metallized layer 46 (respectively corresponding to the metallized layers 35, 36) each having a multilayer structure, and respective preferable layer configurations will be discussed. Excluding the layer configurations of the front-surface metallized layer and the rear-surface metallized layer of the semiconductor element, the power module of the fourth embodiment has the same or corresponding constituent elements as the power module 30 of the third embodiment. These constituent elements are denoted by the same reference numerals in the description and the drawings and will not be described in detail.

Although not shown, the wiring metal plate 12 (see FIGS. 8A and 8B) may be bonded on the semiconductor element 43 by using a solder material. The semiconductor element 43 has a base 44, the front-surface metallized layer 45 disposed on the surface of the base 44, and the rear-surface metallized layer 46 disposed on the rear surface of the base 44. For the material of the base 44, the material of the base 4 described in the first embodiment can be used. The thickness of the base 44 is preferably 150 µm or less.

The front-surface metallized layer 45 is divided by a resist 47 so that a gate pad 48 and an emitter pad 49 are defined. The emitter pad 49 is electrically connected to an external terminal not shown by using a solder material, for example, and the rear-surface metallized layer 46 functions as a collector pad and is electrically connected to a substrate electrode not shown by using the sinterable metal bonding material 2. The gate pad 48 is not solder-bonded.

The front-surface metallized layer 45 has a three-layer structure (45a, 45b, 45c), and the rear-surface metallized layer 46 also has a three-layer structure (46a, 46b, 46c). However, the number of the layers constituting each of the front-surface metallized layer 45 and the rear-surface metallized layer 46 is not limited thereto, and the layers may each have a layer structure composed of two layers or four or more layers, for example. The front-surface metallized layer 45 and the rear-surface metallized layer 46 may be different in the number of layers constituting the layer structure.

Any one of the layers 45a, 45b, 45c constituting the front-surface metallized layer 45 and any one of the layers 46a, 46b, 46c constituting the rear-surface metallized layer 46 are mainly composed of Ni. The ratio of the thickness of the Ni layer of the rear-surface metallized layer 46 to the thickness of the Ni layer of the front-surface metallized layer 45 is preferably 0.5 or more and 2 or less. The thickness of the Ni layer of the front-surface metallized layer 45 is preferably 1.5 µm or more.

In the metallized layers 45, 46 of the semiconductor element 43, preferable layer configurations differ depending on what bonding means is used to form a circuit. In the example described in the fourth embodiment, the solder bonding is performed on the front surface of the semiconductor element 43 and the sinterable metal bonding is performed on the rear surface.

The three-layer structure of the front-surface metallized layer 45 has the AlSi layer 45a, the Ti layer 45b, and the Ni layer 45c from the base 24 side. The AlSi layer 45a is made of an AlSi alloy acquired by adding silicon to aluminum and has a function of improving the adhesion between the base 44 of the silicon-based material and the front-surface metallized layer 45. A similar function is achieved also when an alloy acquired by adding Si to another metal material is used instead of AlSi. The Ti layer 45b has a function of improving the adhesion between the AlSi layer 45a and the Ni layer 45c having poor adhesion. The Ni layer 45c diffuses together with Sn contained in the solder material and has a function of assisting the solder bonding.

The layer structure of the rear-surface metallized layer 46 has the AlSi layer 46a, the Ti layer 46b, and the Ni layer 46c from the base 44 side. The AlSi layer 46a has the function of improving the adhesion between the base 44 of the Si-based material and the front-surface metallized layer 45 as in the description of the AlSi layer 45a of the front-surface metallized layer 45. The Ti layer 46b has a function of improving the adhesion between the AlSi layer 46a and the Ni layer 46c having poor adhesion. The Ni layer 46c diffuses together with the metal fine particles contained in the sinterable metal bonding material 2 and has a function of assisting the sinterable metal bonding.

In the fourth embodiment, the Ni layer 45c of the front-surface metallized layer 45 preferably has a thickness of 1.5 μm or more. Although the Ni layer 46c of the rear-surface metallized layer 46 may have a thickness of 0.5 μm or less, it is known that the warp amount of the semiconductor element 43 can be reduced by setting the Ni layer 46c of the rear-surface metallized layer 46 to the same level of thickness as the Ni layer 45c of the front-surface metallized layer 45.

In the example described in the fourth embodiment, both the front-surface metallized layer 45 and the rear-surface metallized layer 46 have the three-layer structure. However, the number of the layers constituting each of the front-surface metallized layer 45 and the rear-surface metallized layer 46 is not limited thereto, and the layers may each have a layer structure composed of two layers or four or more layers, for example. The front-surface metallized layer 45 and the rear-surface metallized layer 46 may be different in the number of layers constituting the layer structure. Even in these cases, by setting the ratio (wr/wf) of the thickness wr of the rear-surface metallized layer 46 to the thickness wf of the front-surface metallized layer 45 to 0.55 or more and 2.0 or less, the effects described in the fourth embodiment can be obtained.

Fifth Embodiment

Figure 12A:
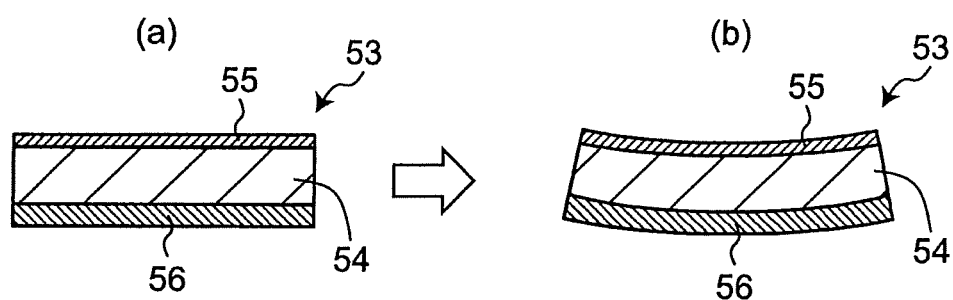
FIG. 12A is a diagram for explaining a power module according to a fifth embodiment of the present invention.
Figure 12B:
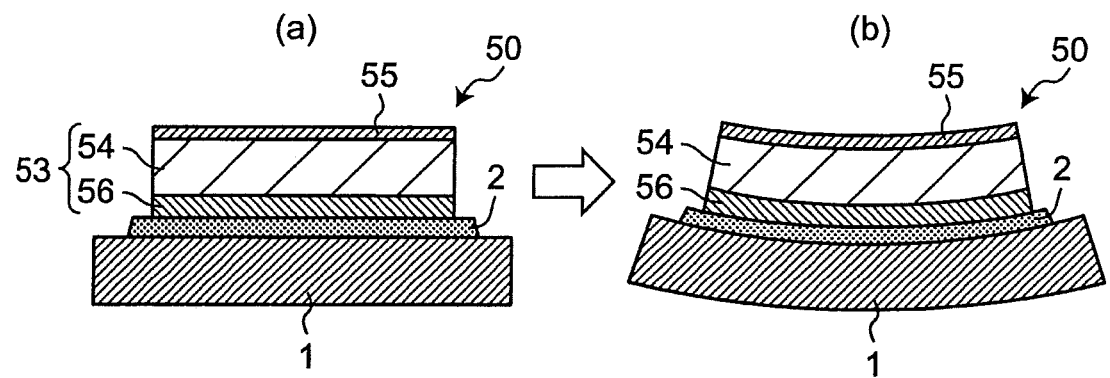
FIG. 12B is a diagram for explaining the power module according to the fifth embodiment of the present invention.

A fifth embodiment of the present invention will be described with reference to FIGS. 12A, 12B, 13A, and 13B. As shown in FIGS. 12A and 12B, a power module 50 according to the fifth embodiment includes the substrate 1 and a semiconductor element 53 bonded on the substrate 1 by using the sinterable metal bonding material 2. The semiconductor element 53 has a base 54, a front-surface metallized layer 55 disposed on the front surface of the base 54, and a rear-surface metallized layer 56 disposed on a rear surface of the base 54.

The semiconductor element 53 is electrically connected to an external terminal by using a bonding wire or a bonding ribbon (not shown) made of aluminum, for example, instead of the wiring metal plate 12 described with reference to FIGS. 8A and 8B. As a result, the strain (or stress) applied to the front-surface metallized layer 55 is sufficiently small (or negligible) as compared to the strain (or stress) applied to the rear-surface metallized layer 56.

FIG. 12A shows an example in which the thickness of the rear-surface metallized layer 56 is larger than the thickness of the front-surface metallized layer 55. In the example of FIG. 12A, it is assumed that the linear expansion coefficient of the substrate 1 is larger than the linear expansion coefficient of the semiconductor element 63. In the fifth embodiment, constituent elements not shown or described are configured in the same way as the first to fourth embodiments.

In the fifth embodiment, a preferable range of the ratio (wr/wf) of the thickness wr of the rear-surface metallized layer 6 to the thickness wf of the front-surface metallized layer 5 is determined according to the magnitude of the linear expansion coefficient of the substrate 1 and the linear expansion coefficient of the semiconductor element 53. This preferable range is established when the strain (or stress) applied to the front-surface metallized layer 55 is sufficiently small as compared to the strain (or stress) applied to the rear-surface metallized layer 56 due to the influence of the solder bonding, the wiring structure, the bonding area, etc. at the time of connection between the front-surface metallized layer 55 and the aluminum wire bond.

Specifically, when the linear expansion coefficient of the substrate 1 is equal to or greater than the linear expansion coefficient of the semiconductor element 53, the thickness ratio (wr/wf) is preferably 1.0 or more and 1.8 or less, and when the linear expansion coefficient of the substrate 1 is smaller than the linear expansion coefficient of the semiconductor element 53, the thickness ratio (wr/wf) is preferably 0.55 or more and less than 1.0.

Figure 13A:
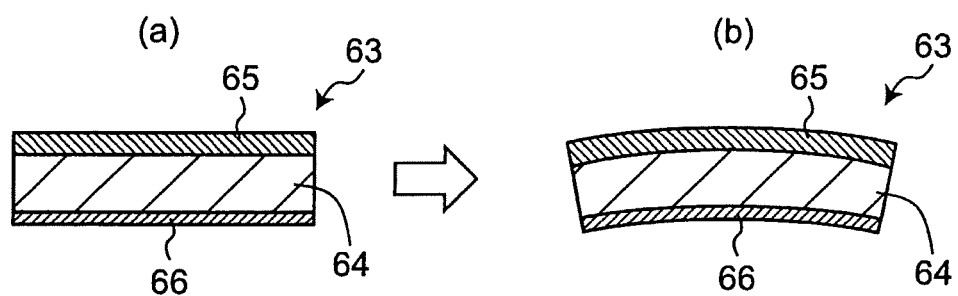
FIG. 13A is a diagram for explaining the power module according to the fifth embodiment of the present invention.
Figure 13B:
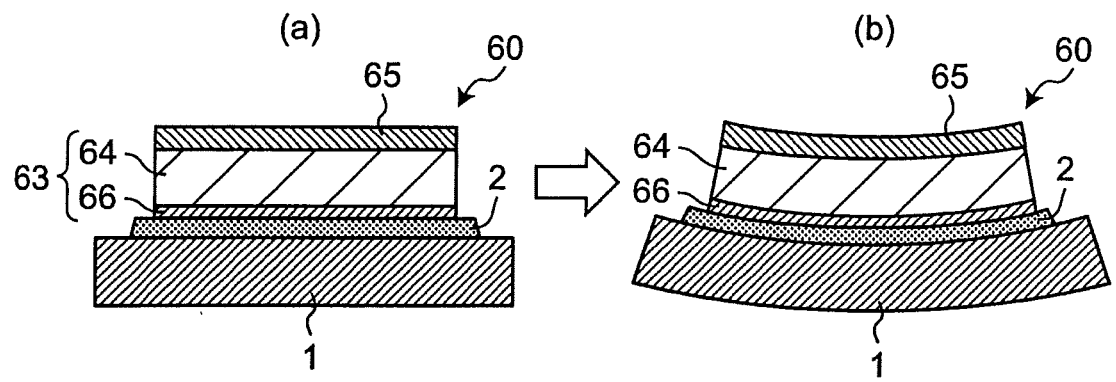
FIG. 13B is a diagram for explaining the power module according to the fifth embodiment of the present invention.

A power module 60 for comparison shown in FIGS. 13A and 13B will be described. The power module 60 includes the substrate 1 and a semiconductor element 63 bonded on the substrate 1 by using the sinterable metal bonding material 2. The semiconductor element 63 has a base 64, a front-surface metallized layer 65 disposed on the front surface of the base 64, and a rear-surface metallized layer 66 disposed on the rear surface of the base 64. FIG. 13A shows an example in which the thickness of the rear-surface metallized layer 66 is smaller than the thickness of the front-surface metallized layer 65.

As shown in FIG. 13A, when the temperature of the semiconductor element 63 is raised, the semiconductor element 63 deforms convexly on the front-surface metallized layer 65 side (at least a force acts in a deforming direction). On the other hand, when the semiconductor element 63 is bonded to the substrate 1 having a linear expansion coefficient larger than that of the semiconductor element 63 and the temperature of the entire bonded body is increased, as shown in FIG. 13B, the entire bonded body deforms convexly on the rear-surface metallized layer 66 side (at least a force acts in a deforming direction). In this case, since a force acts in difference directions on the single semiconductor element 62 and the entire bonded body, the strain applied to the semiconductor element 52 may increase.

On the other hand, since the thickness of the rear-surface metallized layer 56 is larger than the thickness of the front-surface metallized layer 55 in the fifth embodiment, as shown in FIGS. 11A and 11B, the deforming directions at the time of temperature change can be matched between the single semiconductor element 53 and the entire bonded body. As a result, the strain applied at the time of temperature change can be reduced, so that the high reliability of the bonding portion can be obtained.

If the front-surface metallized layer 5 and a wiring material are bonded by the same bonding method as the rear-surface metallized layer 6 and the substrate and have an equivalent strain amount, the optimum ratio (wr/wf) of the thickness wr of the rear-surface metallized layer 6 to the thickness wf of the front-surface metallized layer 5 is 1.

Although the present invention has been described with a plurality of embodiments, the present invention is not limited to these embodiments. To these embodiments, various modifications, improvements, and deletions may be applied. The features described in the embodiments may freely be combined.

EXPLANATIONS OF LETTERS OR NUMERALS

1 substrate; 2 sinterable metal bonding material; 3, 23, 33, 43, 53 semiconductor element; 4, 24, 34, 44, 54 base; 5, 25, 35, 45, 55 front-surface metallized layer; 6, 26, 36, 46, 56 rear-surface metallized layer; 7, 27, 37, 47 resist; 8, 28, 37, gate pad; 9, 29, 39, 49 emitter pad; 10, 20, 30, 50 power module; 11 crack

The invention claimed is:

1. A power semiconductor device comprising:
    a substrate; and
    a semiconductor element bonded on the substrate by using a sinterable metal bonding material,
    wherein the semiconductor element has a base, a first conductive layer disposed on a first surface on a substrate side of the base, and a second conductive layer disposed on a second surface opposite to the first surface of the base, the first conductive layer including an AlSi layer and a Ni layer, the AlSi layer and the Ni layer directly contacting one another, and
    wherein the thickness of the first conductive layer is from 0.5 times to 2.0 times (inclusive) the thickness of the second conductive layer.

2. The power semiconductor device according to claim 1, wherein the thickness of the first conductive layer is from 0.55 times to 1.8 times (inclusive) the thickness of the second conductive layer.

3. The power semiconductor device according to claim 1, wherein
    the second conductive layer has a multilayer structure.

4. The power semiconductor device according to claim 1, wherein
    the base of the semiconductor element has a thickness of 150 µm or less.

5. The power semiconductor device according to claim 1, wherein
    the metal of the sinterable metal bonding material is selected from the group consisting of Ag, Cu, and Ni.

6. The power semiconductor device according to claim 1, wherein
    the Ni layer has a thickness of 1.5 µm or more.

7. The power semiconductor device according to claim 1, wherein
    the thickness of the Ni layer is 1.15 times or more than the thickness of the AlSi layer.

8. The power semiconductor device according to claim 1,
    wherein the base of the semiconductor element is a silicon-based material,
    wherein the second conductive layer is connected to a wiring member by using a solder material containing Sn,
    wherein the first conductive layer has the AlSi layer disposed on a base side of the first conductive layer, an Au layer disposed on a side opposite to the base side of the first conductive layer, and the Ni layer disposed between the AlSi layer and the Au layer, and
    wherein the second conductive layer has a second AlSi layer disposed on a base side of the second conductive layer, a second Au layer disposed on a side opposite to the base side of the second conductive layer, and a second Ni layer disposed between the AlSi layer and the Au layer.

9. The power semiconductor device according to claim 1, wherein
    if the linear expansion coefficient of the substrate is equal to or greater than the linear expansion coefficient of the semiconductor element, the thickness of the first conductive layer is from 1.0 times to 1.8 times (inclusive) the thickness of the second conductive layer, and
    wherein
    if the linear expansion coefficient of the substrate is smaller than the linear expansion coefficient of the semiconductor element, the thickness of the first conductive layer is from 0.55 times (inclusive) to 1.0 times (exclusive) the thickness of the second conductive layer.

* * * * *